US012651835B2

(12) United States Patent
Burnside

(10) Patent No.: US 12,651,835 B2
(45) Date of Patent: Jun. 9, 2026

(54) ELECTRICALLY STEERED DIELECTRIC BEAMFORMER

(71) Applicant: NORTHROP GRUMMAN SYSTEMS CORPORATION, Falls Church, VA (US)

(72) Inventor: Scott R. Burnside, Rescue, CA (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 373 days.

(21) Appl. No.: 18/521,393

(22) Filed: Nov. 28, 2023

(65) Prior Publication Data

US 2025/0174893 A1     May 29, 2025

(51) Int. Cl.
| | |
|---|---|
| *H01Q 15/08* | (2006.01) |
| *G02B 26/08* | (2006.01) |
| *H01L 25/16* | (2023.01) |
| *H01Q 3/26* | (2006.01) |
| *H01Q 3/46* | (2006.01) |
| *H10F 77/42* | (2025.01) |
| *H10N 39/00* | (2023.01) |

(52) U.S. Cl.
CPC ........... *H01Q 3/46* (2013.01); *G02B 26/0875* (2013.01); *H01L 25/167* (2013.01); *H01Q 3/2676* (2013.01); *H10F 77/484* (2025.01); *H01Q 3/2611* (2013.01); *H10N 39/00* (2023.02)

(58) Field of Classification Search
CPC ........ H01Q 15/08; H01Q 15/02; H01Q 15/04;
H01Q 19/06; H01Q 3/46; H01Q 3/2676;
H01Q 3/2611; H01Q 25/008; G02B
26/0875; H10F 77/484; H10N 39/00;
H01L 25/167
See application file for complete search history.

(56) References Cited

U.S. PATENT DOCUMENTS

| | | | |
|---|---|---|---|
| 9,590,300 | B2 | 3/2017 | Artemenko et al. |
| 10,224,638 | B2 | 3/2019 | Artemenko et al. |
| 2018/0166789 | A1* | 6/2018 | Galla ..................... H01Q 15/08 |
| 2018/0183152 | A1 | 6/2018 | Turpin et al. |
| 2019/0058257 | A1* | 2/2019 | Song ..................... H01Q 15/04 |

FOREIGN PATENT DOCUMENTS

WO          2014011087 A1      1/2014

* cited by examiner

*Primary Examiner* — Awat M Salih
(74) *Attorney, Agent, or Firm* — KATTEN MUCHIN ROSENMAN LLP

(57)          ABSTRACT

The proposed dielectric beamformer may be used to provide beam-forming of a transmitted radio-frequency (RF) signal. The dielectric beamformer includes a dielectric lens that provides a means of quickly steering a peak beam of the RF signal in a specific direction, allowing tracking of a distant signal, or multiple distant signals. Moreover, the beam of the RF signal can be steered to place a null in a chose direction to reduce interference. The dielectric beamformer includes a dielectric lens, which includes a first layer including a plurality of photo-voltaic (P-V) cells and a second layer including a plurality of piezoelectric cells, and one or more light sources arranged to emit light beams towards the P-V cells of the first layer. The piezoelectric cells are electrically connected to the P-V cells to receive the electricity produced in the P-V cells.

23 Claims, 4 Drawing Sheets

ELECTRICALLY STEERED DIELECTRIC BEAMFORMER

BACKGROUND

An electronically steerable antenna (ESA) is a system that can steer signals in different directions. ESAs may have computer-controlled arrays of antennas that create a beam of radio waves. ESAs are used for beamforming in radio-frequency (RF) applications. The common type of systems for ESA is actively electrically steered antenna (AESA). An alternative type for ESA is to have an actuator-controlled shaped reflector antenna or reflect array.

AESAs are expensive and elaborate systems and use high power to control the gain and phase of the signals to each of the elements in the array. Additionally, phase matching and alignment of each element feed and element of the array must be done to achieve acceptable performance. Actuator-controlled shaped reflectors, such as an alignable parabolic dish, is difficult to design, is expensive to implement, and carries with it the tasks of maintenance and watching for metallic fatigue.

There are needs for ESA systems that provide agile capability in a thin, light-weight and robust package as well as lower cost than the complicated AESA or steered or shape-changing reflector dish systems.

SUMMARY

The disclosed invention provides electrically steered dielectric beamformer that includes a dielectric lens that is electrically controlled to allow for agile beamforming of a radio-frequency (RF) signal. The disclosed invention also provides an electrically steerable antenna (ESA) system that uses the electrically steered dielectric beamformer.

The dielectric lens may be used to provide beamforming of a transmitted RF signal. The dielectric lens provides a means of quickly steering a peak beam of the RF signal in a specific direction, allowing tracking of a distant signal, or multiple distant signals. Moreover, the beam of the RF signal can be steered to place a null in a chosen direction to reduce interference.

The dielectric beamformer provides a beam-steering capability, is thinner than an AESA, and is much smaller than a steered or shape-changing reflector dish. This device could also provide a means of de-focusing a beam, or providing other beam control tasks, such as splitting a beam. It is expected that this device will enable techniques that have not been previously conceived. This beam-shaping, steering, or defocusing can be done quickly with the electronic controls driving the laser(s). This agile capability is a unique feature of the device of the disclosed invention. This capability could also be done on the sub-wavelength scale, providing a tunable metamaterial lens for control of an RF wave. This may have applications in cloaking, low probability of detection, or engineered-reflection systems.

These advantages and others are achieved, for example, by a dielectric beamformer that includes a dielectric lens and one or more light sources arranged to emit light toward the dielectric lens. The dielectric lens includes a first layer, which includes a plurality of photo-voltaic (P-V) cells that are constructed to produce electricity responding to light, and a second layer placed on the first layer. The second layer includes a plurality of dielectric cells that are constructed to change dielectric constants responding to electricity. The dielectric cells are electrically connected to the P-V cells to receive the electricity produced in the P-V cells. The one or more light sources are arranged to emit light beams towards the P-V cells of the first layer.

The one or more light sources may include lasers. The dielectric cells may be made of a piezoelectric material. The P-V cells may be arranged in a two-dimensional P-V cell array and the dielectric cells may be arranged in a two-dimensional dielectric cell array. The dielectric cells in the dielectric cell array may be electrically one-to-one connected to the P-V cells in the P-V cell array. The P-V cell may be electrically isolated from one another, and the dielectric cells may be electrically isolated from one another. The one or more light sources may include a plurality of light sources that are arranged to one-to-one correspond to the P-V cells. The one or more light sources may include a scanning light source that is configured to scan faces of the P-V cells to stimulate the P-V cells in sequence.

These advantages and others are achieved, for example, by a steerable antenna system that includes a dielectric lens, one or more light sources arranged to emit light toward the dielectric lens, and at least one antenna system configured to emit signals towards the dielectric lens. The dielectric lens includes a first layer, which includes a plurality of photo-voltaic (P-V) cells, which are constructed to produce electricity responding to light, and a second layer placed on the first layer. The second layer includes a plurality of dielectric cells that are constructed to change dielectric constants responding to electricity. The dielectric cells are electrically connected to the P-V cells to receive the electricity produced in the P-V cells. The one or more light sources are arranged to emit light beams towards the P-V cells of the first layer. The one or more light sources may be configured to be controlled to create precessions of the emitted light beams to provide functionality of a target tracking antenna system. The signals emitted from the at least one antenna system may include radio-frequency (RF) signals. The antenna system may include a horn antenna or a semi-directional antenna. The one or more light sources may be arranged around the antenna system.

BRIEF DESCRIPTION OF THE DRAWINGS

The preferred embodiments described herein and illustrated by the drawings hereinafter are included to illustrate and not to limit the invention, where like designations denote like elements.

DETAILED DESCRIPTION

Figure 1:
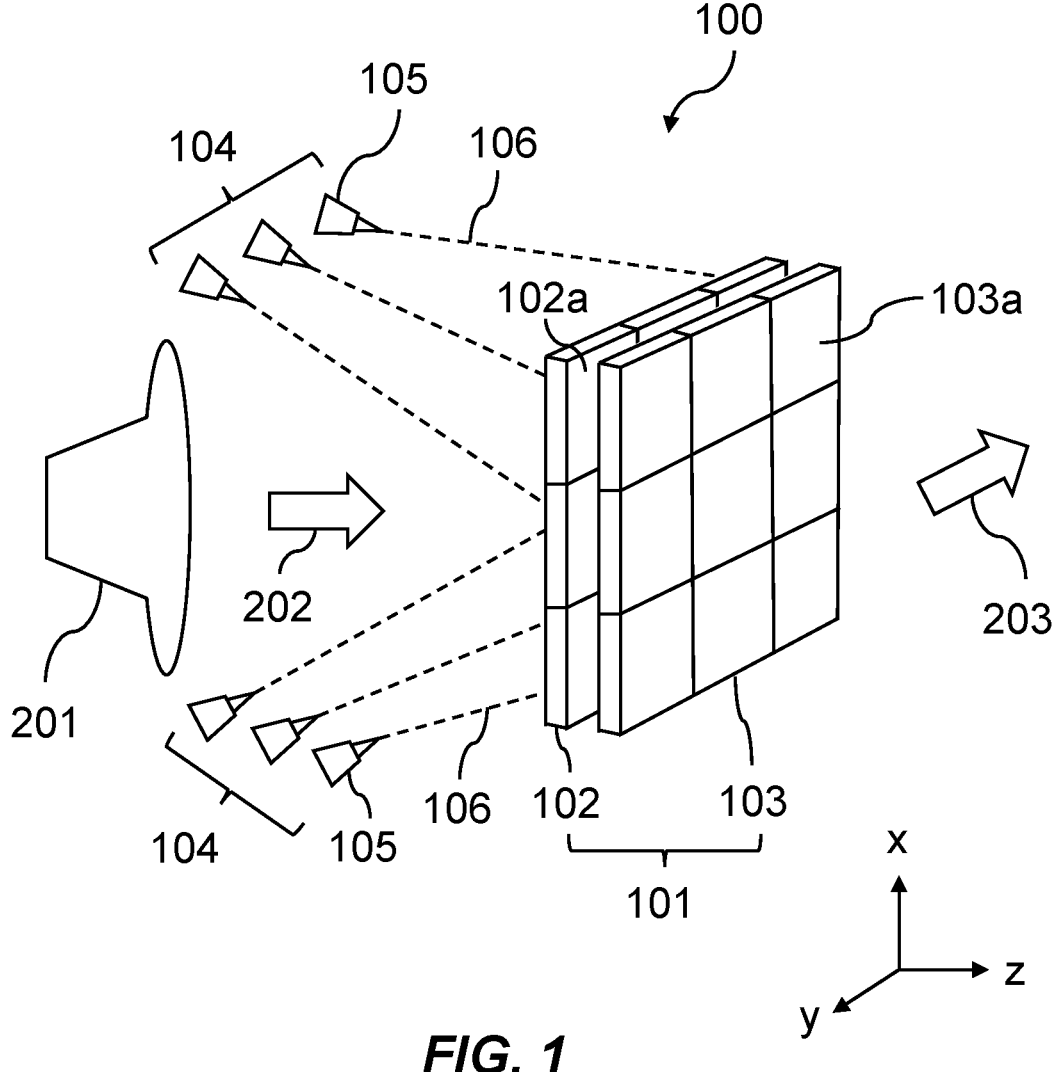
FIGS. 1-2 are a perspective view and a side view of the dielectric beamformer of the disclosed invention, respectively.

The following detailed description is merely exemplary in nature and is not intended to limit the described embodiments or the application and uses of the described embodiments. All of the implementations described below are exemplary implementations provided to enable persons skilled in the art to make or use the embodiments of the disclosure and are not intended to limit the scope of the disclosure, which is defined by the claims. It is also to be understood that the drawings included herewith only provide diagrammatic representations of the presently preferred structures of the present invention and that structures falling within the scope of the present invention may include structures different than those shown in the drawings.

Figure 2:
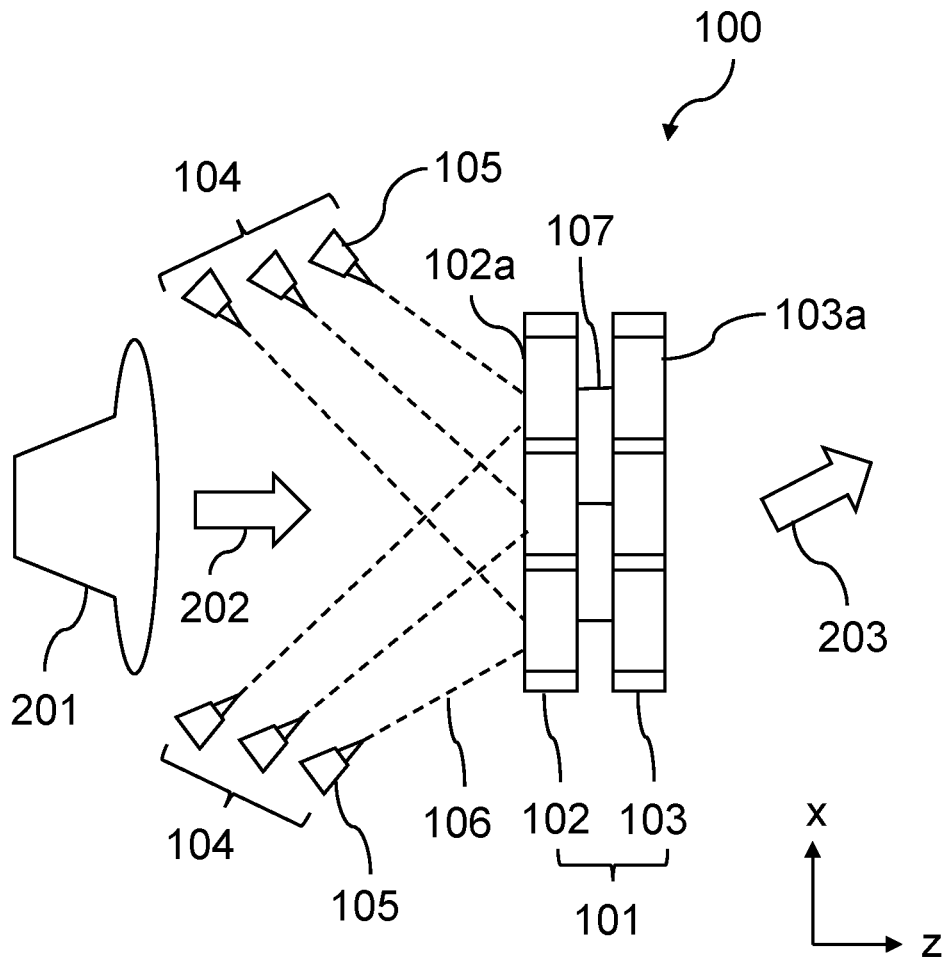

With reference to FIGS. 1-2, shown are a perspective view and a side view of the dielectric beamformer of the disclosed invention, respectively. Dielectric beamformer 100 includes dielectric lens 101 and stimulation device 104 that is configured to stimulate the dielectric lens 101 to perform signal beam steering or null steering. The dielectric lens 101 is made up of individual first and second layers 102, 103 that may be combined together into one structure. The dielectric lens 101 is placed in front of a feed antenna 201 (e.g., a horn or other semi-directional antenna) that is constructed to emit signals 202 towards the dielectric lens 101. Referring to FIG. 1, when the input signals 202, emitted in the z-direction from the feed antenna 201, pass through the dielectric lens 101, the output signal 203 from the dielectric lens 101 may be steered off from the z-axis direction, depending on how the dielectric lens 101 is stimulated or controlled. The dielectric beamformer 100 of the disclosed invention provides ability to perform a signal beam steering, null steering, and/or other tunings of the signals according to the needs of the fielded system.

The dielectric lens 101 includes an RF transparent first layer 102 and a second layer 103. The first layer 102 of the dielectric lens 101 includes a plurality of photo-voltaic (P-V) cells (or sites) 102a, such as solar cells, that generate electricity (e.g., voltage or electrical signal) when illuminated by a laser or light beam 106. In order to stimulate or activate the P-V cells 102a, stimulation device 104 is placed behind the first layer 102 as shown in FIGS. 1-2. The stimulation device 104 may include one or more light sources 105 that produce light beams 106 that are configured to properly and efficiently activate the P-V cells 102a. The one or more light sources 105 may be lasers that generate laser beams. The laser or light beams 106 produced by the light sources 105 are directed to the P-V cells 102a. Upon receiving the laser or light beams 106, the photo-voltaic cells 102a of the first layer 102 are activated to generate voltages or electrical signals.

The second layer 103 includes a plurality of dielectric cells 103a. Preferably, the dielectric cells 103a are made of a low-loss piezoelectric material. In this disclosure, the dielectric cells 103a may be referred to as piezoelectric cells 103a. Examples of the piezoelectric material may include zinc oxide, barium titanate, lead zirconate titanate (PZT), lead titanate, gallium nitride, and polyvinylidene fluoride (PVDF).

Each of the piezoelectric cells 103a is in electrical contact with one or some of the P-V cells 102a such that electrical outputs (e.g. voltage or electric signal) from the P-V cells 102a are passed to the piezoelectric cells 103a. FIG. 2 exemplarily shows electrical contacts or connections 107 that electrically connect a P-V cells 102a of the first layer 102 to the corresponding piezoelectric cells 103a to transfer electrical outputs generated in the P-V cells to the piezoelectric cells 103a. The dielectric lens 101 may include necessary circuits (not shown), such as ground circuits, to properly transfer the electrical outputs to the piezoelectric cells 103a from the P-V cells 102a.

The P-V cells 102a may be arranged in a two-dimensional P-V cell array and the piezoelectric cells 103a may be arranged in a two-dimensional dielectric cell array. FIG. 1 exemplarily shows 3×3 arrays of the P-V cells 102a and the piezoelectric cells 103a for illustration purpose. However, the arrays are not limited to the 3×3 arrays. Any sizes of arrays can be employed for the dielectric beamformer 100 of the disclosed invention. The first layer 102 and the second layer 103 may be stacked or integrated together to form one structure. Alternatively, the first layer 102 and the second layer 103 may be separate layers while maintaining electrical contacts between the P-V cells 102a and the piezoelectric cells 103a.

The piezoelectric cells 103a may be electrically one-to-one connected to the P-V cells 102a. In this case, one of the piezoelectric cell 103a is connected to only one of the P-V cells 102a. However, the dielectric lens 101 is not limited to this configuration. Depending on applications and needs of the fielded system, the piezoelectric cells 103a do not have to be electrically one-to-one connected to the P-V cells 102a. In other words, one piezoelectric cell may be electrically connected to multiple P-V cells. Alternatively, one P-V cell may be electrically connected to multiple piezoelectric cells. The P-V cell 102a may be electrically isolated from one another so that electricity generated in one P-V cell is not provided to the other P-V cells. The piezoelectric cells 103a may be electrically isolated from one another so that electricity received in one piezoelectric cell from the corresponding P-V cell does not leak into the other piezoelectric cells.

The one or more light sources 105 may be placed behind the first layer 102, as shown in FIGS. 1-2, to efficiently emit light beams 106 onto the P-V cells 102a. The light sources 105 May be placed adjacent to or around the feed antenna 201 in the manner in which signals 202 emitted from the feed antenna 201 are not interrupted by the light sources 105 while light beams 106 emitted from the light sources 105 properly reach the designated P-V cells without interruption. The light source 105 may be configured to emit a light beam 106 onto only one P-V cell (one-to-one correspondence). Alternatively, the light source 105 may be configured to emit a light beam 106 onto multiple P-V cells. Alternatively, a single light source may be configured to scan faces of the P-V cells 102a to stimulate the P-V cells 102a in sequence. Characteristics of the light (e.g., intensity) emitted from the light source 105 and/or any movement (e.g., orientation) of the light source 105 may be controlled by a controller (not shown) coupled to the light sources 105.

Figure 3:
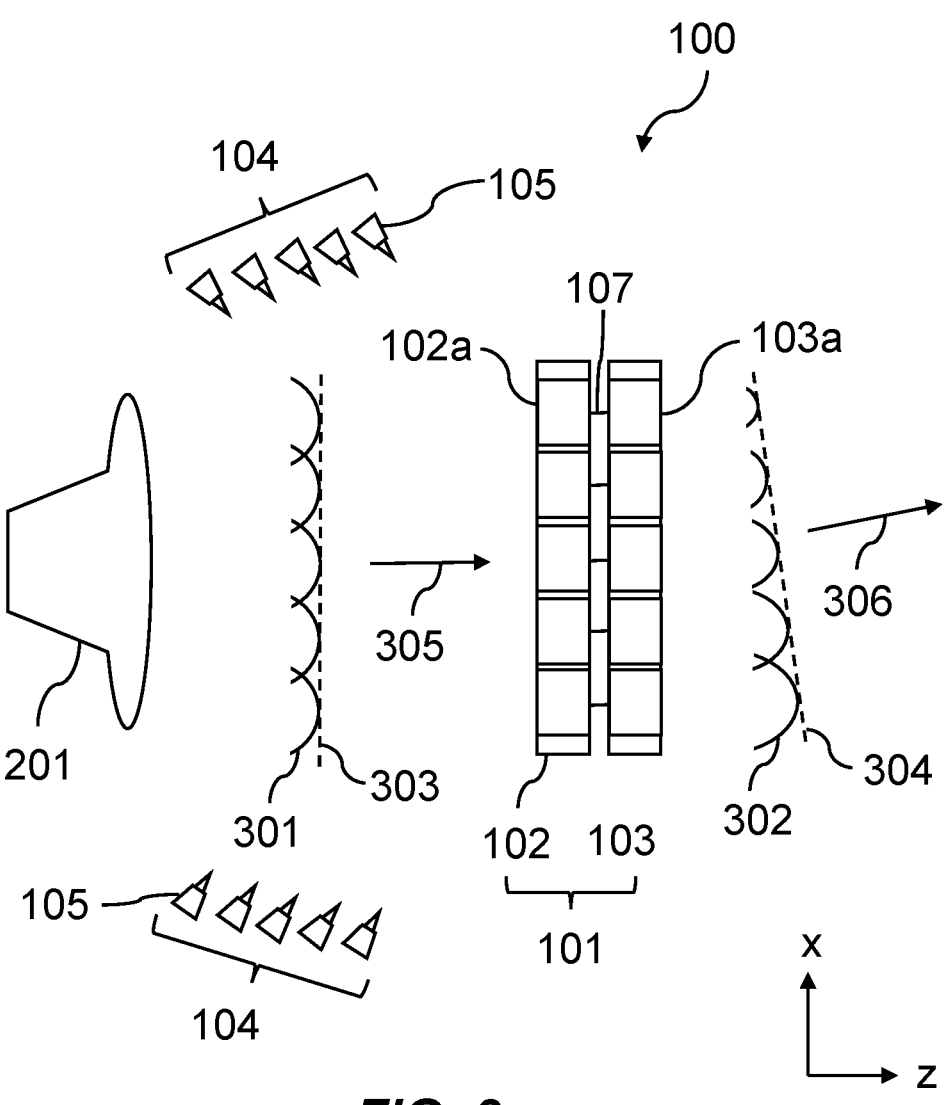
FIG. 3 is an exemplary illustration that shows beam steering mechanism of the dielectric beamformer.

With reference to FIG. 3, shown is an exemplary illustration that shows beam steering mechanism of the dielectric beamformer 100 of the disclosed invention. The illustration in FIG. 3 is simplified for description purpose. The feed antenna 201 emits signals that comprise electromagnetic waves 301 into propagation direction 305 along the z-direction. FIG. 3 exemplarily shows a plane electromagnetic waves 301 with a wavefront 303 traveling towards the dielectric lens 101. The signals from the feed antenna 201 may be radio-frequency (RF) signals.

While electromagnetic waves 301 are traveling inside a dielectric layer such as the piezoelectric cell 103a, the wavelength (and frequency) of the electromagnetic waves 303 changes based on the magnitude of the dielectric constant (permittivity) of the dielectric layer. Generally known in the art, the wavelength of the electromagnetic waves in a dielectric layer is smaller than the wavelength of the electromagnetic waves in air (or vacuum). When the electromagnetic waves exit the dielectric layer, the wavelength is recovered to the wavelength in air (or vacuum). The dielectric beamformer 100 of the disclosed invention utilizes this effect of the wavelength changes of electromagnetic waves in dielectric layers to perform signal beam steering or null steering.

When the light source 105 emits a light beam to the P-V cell 102a, the P-V cell 102a is activated to generate electricity (e.g. voltage or electrical signal). The generated electricity is applied to the corresponding piezoelectric cell 103a through the electrical contact 107. When the electricity is applied to the piezoelectric cell 103a, dielectric constant (permittivity) of the piezoelectric cell 103a changes, stimulated by the electricity. Generally known in the art, the dielectric constant of the piezoelectric cell may increase, as the applied voltage to the piezoelectric cell increases. The P-V cells 102a are independently controlled by the light sources 105. Consequently, the P-V cells 102a can be activated differently by, for example, controlling intensities of the light beams 106 or turning on or off the lasers 105. Differently activated P-V cells 102 may generate, for example, different amounts of electrical voltage. As a result, the piezoelectric cells 103a individually connected to the P-V cells 102a are stimulated differently, resulting in having different dielectric constants. The differences in dielectric constants over the piezoelectric cells 103a cause differences in wavelengths of the electromagnetic waves traveling inside the piezoelectric cells 103a and create phase shifts of the electromagnetic waves 302 when the electromagnetic waves 302 exit the dielectric lens 101.

As shown in FIG. 3, the electromagnetic waves 301, before passing the dielectric lens 101, have phases that define the wavefront 303 propagating in a direction 305 parallel to the z-direction. However, after passing the dielectric lens 101, the electromagnetic waves 302 have all different phases due to phase shifts caused by the differences of dielectric constants of the piezoelectric cells 103a that are individually controlled by the corresponding light sources 105. FIG. 3 exemplarily shows gradually changing phase shifts of the electromagnetic waves 302 affected by the piezoelectric cells 103a having different (gradually changing) dielectric constants. These phases of the electromagnetic waves 302 define the tilted wavefront 304, which indicates that the electromagnetic waves 302 propagate in a direction 306 that is steered away from the direction 305.

The differences in dielectric constants of the piezoelectric cells 103a create "shaped permittivity" in the second layer 103 that is a piezoelectric cell layer. The "shaped permittivity" of the piezoelectric cell layer has an impact on the propagation direction of the output signal 203 output from the dielectric lens 101. By using the "shaped permittivity" of the piezoelectric cells 103a controlled by the light sources 105, the dielectric beamformer 100 performs signal tunings, such as beam steering and null steering, according to the applications and the needs of the fielded system.

Figure 4:
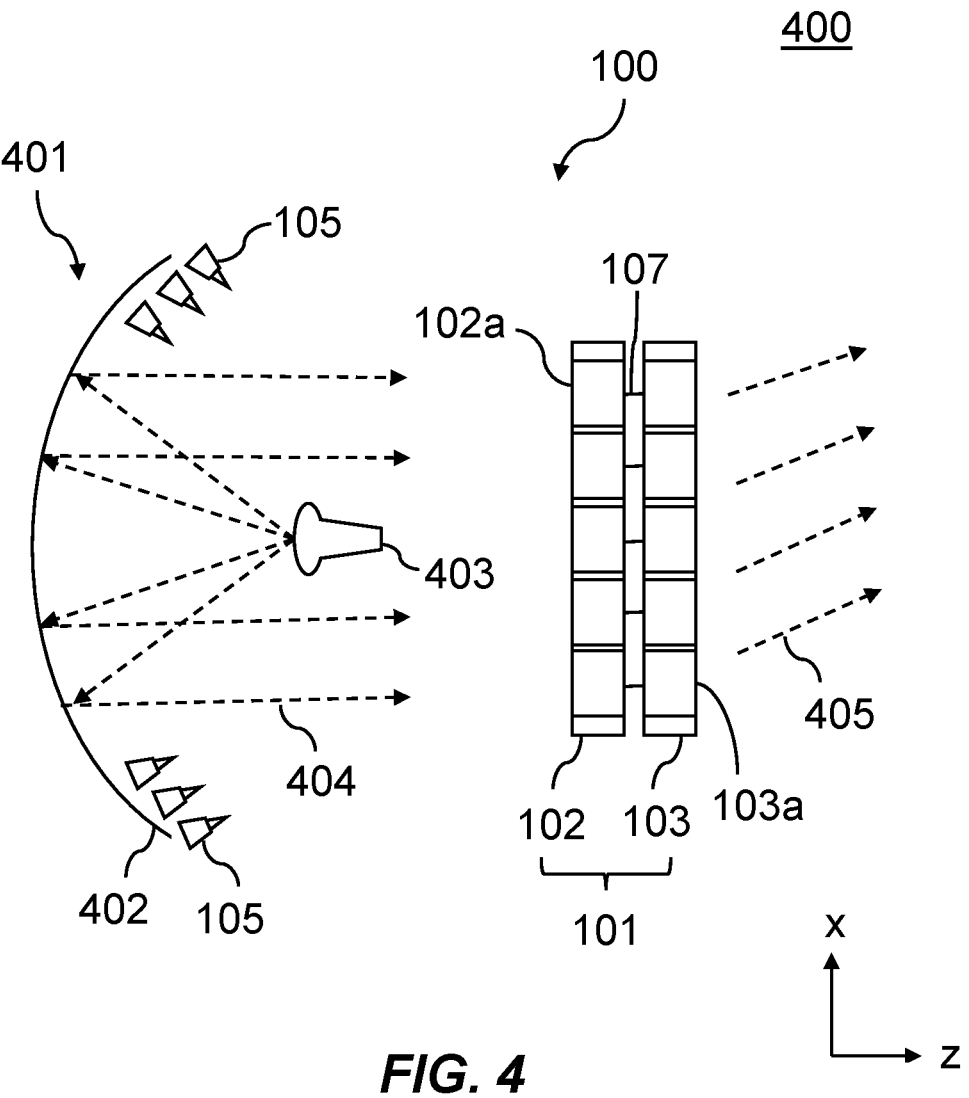
FIG. 4 shows an exemplary electrically steerable antenna (ESA) system of the disclosed invention equipped with the dielectric beamformer.

With reference to FIG. 4, shown is an exemplary electrically steerable antenna (ESA) system 400 of the disclosed invention equipped with the dielectric beamformer 100. The ESA system 400 includes antenna system 401 and dielectric beamformer 100. For description purpose, FIG. 4 shows exemplary antenna system 401 that is constructed with parabolic dish 402 and feed horn 403. However, any types of antenna system may be employed for the ESA system 400 of the disclosed invention. For example, the antenna system 401 may be a horn antenna system or a semi-directional antenna system.

The antenna system 401 may emit RF signals 404. The beamformer 100 is coupled to the antenna system 401 to control the RF signals 404 emitted from the antenna system 401. The dielectric lens 101 is placed in front of the parabolic dish 402 to receive the RF signals 404, and the light sources (or lasers) 105 are deployed to control the dielectric lens 101. FIG. 4 exemplarily shows the light sources 105 placed around the parabolic dish 402. However, the light sources 105 may be placed any proper locations, based on applications and structures of the antenna system 401, to efficiently emit light beam 106 to the dielectric lens 101.

As described above, the dielectric beamformer 100 is configured to independently control the magnitude of the dielectric constants of piezoelectric cell 103a. The lasers or light sources 105 are used to provide the stimulation for the P-V cells 102a and thence to the piezoelectric cells 103a. In this manner, the lasers or light sources 105 become the mechanism to perform beam-steering or null-steering, depending on the needs of the situation. As the RF signals 404 coming from the antenna system 401 pass through the dielectric lens 101 with its array of laser-controlled dielectric material cells, the RF signals encounter a field of the "shaped permittivity" of the dielectric lens 101, as described above. The shaping of the permittivity across the dielectric lens 101 provides the ability to steer a beam, a null, or to provide other tuning of the RF signal according to the needs of the fielded system. FIG. 4 exemplarily shows the output RF signals 405 from the dielectric lens 101 which are steered from the input RF signals 404.

The dielectric beamformer 100 of the disclosed invention may be used to provide beamforming of a transmitted RF signal. The dielectric lens 101 provides means of quickly steering a peak beam of the RF signal in a specific direction, allowing tracking of a distant signal, or multiple distant signals. Moreover, the beam of the RF signal can be steered to place a null in a chosen direction to reduce interference.

Beamformer 100 can be constructed to create a precession of the beam. By precessing the beam and measuring signal strength, a tracking antenna system is created for purposes of target tracking. By using the described technique, the precession angle can be varied. This may provide the ability to quickly change between a "search" state and a "track" state in a tracking antenna system.

Since many modifications, variations, and changes in detail can be made to the described preferred embodiments of the invention, it is intended that all matters in the foregoing description and shown in the accompanying drawings be interpreted as illustrative and not in a limiting sense. Consequently, the scope of the invention should be determined by the appended claims and their legal equivalents.

What is claimed is:

1. A dielectric beamformer, comprising:
   a dielectric lens comprising:
      a first layer comprising a plurality of photo-voltaic (P-V) cells that are constructed to produce electricity responding to light; and
      a second layer placed on the first layer, wherein the second layer comprises a plurality of dielectric cells that are constructed to change dielectric constants responding to electricity, and wherein the dielectric cells are electrically connected to the P-V cells to receive the electricity produced in the P-V cells; and
   one or more light sources arranged to emit light beams towards the P-V cells of the first layer.

2. The dielectric beamformer of claim 1 wherein the one or more light sources comprise lasers.

3. The dielectric beamformer of claim 1 wherein the dielectric cells are made of a piezoelectric material.

4. The dielectric beamformer of claim 3 wherein the piezoelectric material comprises one or more selected from the group consisting of zinc oxide, barium titanate, lead zirconate titanate (PZT), lead titanate, gallium nitride, and polyvinylidene fluoride (PVDF).

5. The dielectric beamformer of claim 1 wherein the P-V cells comprise solar cells.

6. The dielectric beamformer of claim 1 wherein the P-V cells are arranged in a two-dimensional P-V cell array and the dielectric cells are arranged in a two-dimensional dielectric cell array.

7. The dielectric beamformer of claim 6 wherein the dielectric cells in the dielectric cell array are electrically one-to-one connected to the P-V cells in the P-V cell array.

8. The dielectric beamformer of claim 1 wherein the P-V cell are electrically isolated from one another, and the dielectric cells are electrically isolated from one another.

9. The dielectric beamformer of claim 1 wherein the one or more light sources comprise a plurality of light sources that are arranged to one-to-one correspond to the P-V cells.

10. The dielectric beamformer of claim 1 wherein the one or more light sources comprise a scanning light source that is configured to scan faces of the P-V cells to stimulate the P-V cells in sequence.

11. A steerable antenna system, comprising:
a dielectric lens comprising:
 a first layer comprising a plurality of photo-voltaic (P-V) cells that are constructed to produce electricity responding to light; and
 a second layer placed on the first layer, wherein the second layer comprises a plurality of dielectric cells that are constructed to change dielectric constants responding to electricity, and wherein the dielectric cells are electrically connected to the P-V cells to receive the electricity produced in the P-V cells;
one or more light sources arranged to emit light beams towards the P-V cells of the first layer; and
at least one antenna system configured to emit signals towards the dielectric lens.

12. The steerable antenna system of claim 11 wherein the signals emitted from the at least one antenna system comprise radio-frequency (RF) signals.

13. The steerable antenna system of claim 11 wherein the antenna system comprises a horn antenna or a semi-directional antenna.

14. The steerable antenna system of claim 11 wherein the one or more light sources are arranged around the antenna system.

15. The steerable antenna system of claim 11 wherein the one or more light sources comprise lasers.

16. The steerable antenna system of claim 11 wherein the dielectric cells are made of a piezoelectric material.

17. The steerable antenna system of claim 11 wherein the P-V cells comprise solar cells.

18. The steerable antenna system of claim 11 wherein the P-V cells are arranged in a two-dimensional P-V cell array and the dielectric cells are arranged in a two-dimensional dielectric cell array.

19. The steerable antenna system of claim 18 wherein the dielectric cells in the dielectric cell array are electrically one-to-one connected to the P-V cells in the P-V cell array.

20. The steerable antenna system of claim 11 wherein the P-V cell are electrically isolated from one another, and the dielectric cells are electrically isolated from one another.

21. The steerable antenna system of claim 11 wherein the one or more light sources comprise a plurality of light sources that are arranged to one-to-one correspond to the P-V cells.

22. The steerable antenna system of claim 11 wherein the one or more light sources comprise a scanning light source that is configured to scan faces of the P-V cells to stimulate the P-V cells in sequence.

23. The steerable antenna system of claim 11 wherein the one or more light sources are configured to be controlled to create precessions of the emitted light beams to provide functionality of a target tracking antenna system.

* * * * *